United States Patent
Wu et al.

(10) Patent No.: US 10,038,545 B1
(45) Date of Patent: Jul. 31, 2018

(54) SYSTEMS AND METHODS FOR CLOCK AND DATA RECOVERY

(71) Applicant: Xilinx, Inc., San Jose, CA (US)

(72) Inventors: Zhaoyin D. Wu, San Jose, CA (US); Winson Lin, Daly City, CA (US); Yu Xu, Palo Alto, CA (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/660,397

(22) Filed: Jul. 26, 2017

(51) Int. Cl.
*H03L 7/08* (2006.01)
*H03L 7/00* (2006.01)
*H04L 7/00* (2006.01)
*H03L 7/081* (2006.01)
(Continued)

(52) U.S. Cl.
CPC .......... *H04L 7/0025* (2013.01); *H03L 7/0814* (2013.01); *H04L 7/0004* (2013.01); *H04L 7/0012* (2013.01); *H04L 7/033* (2013.01); *H04L 7/0337* (2013.01); *H04L 43/028* (2013.01);
(Continued)

(58) Field of Classification Search
CPC ... H04L 7/0331; H04L 7/0025; H04L 7/0079; H04L 7/0087; H04L 1/205; H04L 7/0041; H04L 2027/0067; H04L 7/0058; H04L 7/0334; H04L 7/0016; H04L 7/0338; H04L 7/04; H04L 2027/0065; H04L 27/01; H04L 7/0062; H04L 7/0278; H04L 7/091; H03L 7/091; H03L 7/095; H03L 7/18; G01R 31/31709
See application file for complete search history.

(56) References Cited

U.S. PATENT DOCUMENTS 7,149,265 B2 * 12/2006 Wang ............... H04H 40/45
375/354
7,295,644 B1 * 11/2007 Wu ............... H03L 7/0807
375/375

(Continued)

OTHER PUBLICATIONS

U.S. Appl. No. 15/660,141, filed Jul. 26, 2017, Wu, Zhaoyin D., et al., "Systems and Methods for Clock and Data Recovery", San Jose, CA USA.

(Continued)

*Primary Examiner* — Vibol Tan
(74) *Attorney, Agent, or Firm* — David O'Brien

(57) ABSTRACT

A clock and data recovery (CDR) circuit includes a phase detector, a frequency accumulator, and a sequencer circuit. The phase detector generates a phase detect result signal in response to phase detection of a plurality of samples, which are generated by sampling a first data signal from a receiver using a sampling clock. The frequency accumulator accumulates, using a frequency register, frequency offset information from the phase detect result signal to generate an accumulated total. The frequency offset information is associated with a frequency difference between a first reference clock of the receiver and a second reference clock associated with the first data signal. The accumulated total is stored in the frequency register and provided from the frequency register for updating the sampling clock. The sequencer circuit is configured to perform a reset operation to reset the accumulated total in the frequency register based on a sequence of sequence elements.

20 Claims, 8 Drawing Sheets

(51) Int. Cl.
  *H04L 7/033* (2006.01)
  *H04L 12/26* (2006.01)
(52) U.S. Cl.
  CPC ............ *H04L 43/16* (2013.01); *H04L 7/0334* (2013.01); *H04L 7/0338* (2013.01)

(56) References Cited

U.S. PATENT DOCUMENTS

| | | | | |
|---|---|---|---|---|
| 7,738,617 B1 * | 6/2010 | Fortin | ................ | H03L 7/0814 |
| | | | | 327/141 |
| 8,139,702 B1 * | 3/2012 | Fortin | ................ | H03L 7/0814 |
| | | | | 375/354 |
| 8,253,451 B1 | 8/2012 | Hsieh et al. | | |
| 8,289,032 B2 * | 10/2012 | Lee | ................ | G01R 31/31709 |
| | | | | 324/613 |
| 8,331,512 B2 * | 12/2012 | Lee | ................ | H03L 7/0814 |
| | | | | 375/355 |
| 8,774,337 B2 * | 7/2014 | Lee | ................ | H03L 7/0814 |
| | | | | 375/355 |
| 9,065,601 B1 | 6/2015 | Jenkins et al. | | |
| 9,106,399 B2 * | 8/2015 | Lee | ................ | H03L 7/0814 |
| 9,294,260 B2 * | 3/2016 | Giaconi | ................ | H04L 7/0041 |
| 9,337,992 B2 * | 5/2016 | Lee | ................ | H03L 7/07 |
| 9,356,775 B1 | 5/2016 | Xu et al. | | |
| 9,413,524 B1 * | 8/2016 | Xu | ................ | H04L 7/0087 |
| 9,423,441 B2 * | 8/2016 | Lee | ................ | G01R 31/31709 |
| 9,455,848 B1 | 9/2016 | Zhang et al. | | |
| 9,515,814 B2 * | 12/2016 | Lee | ................ | H03L 7/0814 |
| 9,537,617 B2 * | 1/2017 | Chandrasekaran | ... | H04L 7/0079 |
| 9,559,878 B2 * | 1/2017 | Giaconi | ................ | H04L 7/0041 |
| 9,749,125 B2 * | 8/2017 | Khan | ................ | H04L 7/04 |
| 9,768,947 B2 * | 9/2017 | Hossain | ................ | H04L 7/0016 |
| 9,774,441 B2 * | 9/2017 | Lee | ................ | H03L 7/07 |
| 9,791,492 B2 * | 10/2017 | Lee | ................ | G01R 31/31709 |

OTHER PUBLICATIONS

U.S. Appl. No. 15/346,434, filed Nov. 8, 2016, Yu Xu, "Resolving Meta-Stability in a Clock and Data Recovery Circuit", San Jose, CA USA.

* cited by examiner

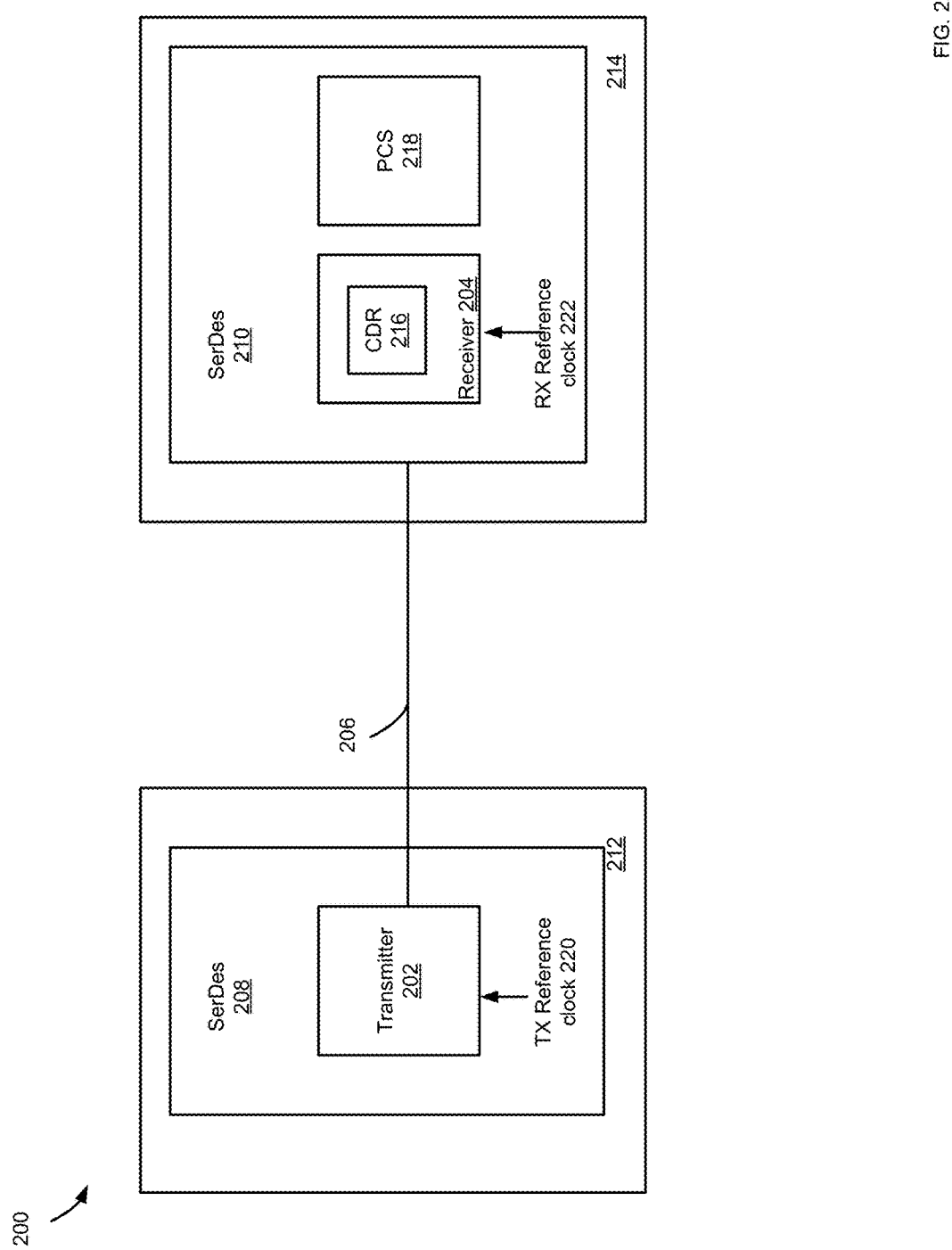

| Sequence Index 502 | Sequence Values (ppm) 504 | Sequence Index 502 | Sequence Values (ppm) 504 |
|---|---|---|---|
| 1 | 0 | 12 | 6,000 |
| 2 | 1,000 | 13 | -6,000 |
| 3 | -1,000 | 14 | 7,000 |
| 4 | 2,000 | 15 | -7,000 |
| 5 | -2,000 | 16 | 8,000 |
| 6 | 3,000 | 17 | -8,000 |
| 7 | -3,000 | 18 | 9,000 |
| 8 | 4,000 | 19 | -9,000 |
| 9 | -4,000 | 20 | 10,000 |
| 10 | 5,000 | 21 | -10,000 |
| 11 | -5,000 | | |

FIG. 5

SYSTEMS AND METHODS FOR CLOCK AND DATA RECOVERY

FIELD

Examples of the present disclosure generally relate to integrated circuits (ICs) and, in particular, to an embodiment related to systems and methods for clock and data recovery (CDR).

BACKGROUND

Data transmission is an important application of many integrated circuit devices. Data may be transmitted according to different transmission protocols, and may be transmitted as serial data or parallel data. A clock and data recovery (CDR) circuit is an important block in a receiver system for high-speed serial communications. The CDR circuit may generate a sampling clock with the correct sampling clock phase for data recovery. The quality of the high-speed serial communication link may be sensitive to the sampling clock phase, especially in the presence of jitter and noise. A CDR circuit may be used to control operation of a phase interpolator ("PI") for generating the sampling clock. A lock condition for the CDR circuit may be used to determine that the sampling clock from the PI is valid. However, lock conditions of the CDR are susceptible to differences between transmitter and receiver reference clock signals. If both ends of a serial link use the same reference clock signal, then the CDR circuit may be relatively simple. However, each end of a serial data transmission link may use a separate, uncorrelated reference clock. If the frequencies of the transmitter and receiver reference clocks are different, then the phase error may change continuously. As the difference in reference clock frequencies increases, the phase error may change more quickly, impacting the data recovery performance.

Accordingly, it would be desirable and useful to provide an improved CDR circuit.

SUMMARY

In some embodiments in accordance with the present disclosure, a clock and data recovery (CDR) circuit includes a phase detector, a frequency accumulator, and a sequencer circuit. The phase detector is configured to generate a phase detect result signal in response to phase detection of a plurality of samples, the plurality of samples being generated by sampling a first data signal received from a receiver based on a sampling clock. The frequency accumulator is configured to: accumulate, using a frequency register, frequency offset information from the phase detect result signal to generate an accumulated total; store, in the frequency register, the accumulated total; and provide, from the frequency register, the accumulated total for updating the sampling clock. The frequency offset information is associated with a frequency difference between a first reference clock of the receiver and a second reference clock associated with the first data signal. The sequencer circuit is configured to: perform a reset operation to reset the accumulated total in the frequency register based on a sequence of sequence elements.

In some embodiments, the sequencer circuit is configured to in response to a first determination of a locked condition of the sampling clock with respect to the first data signal based on a lock condition signal from a lock detector circuit, stop the reset operation.

In some embodiments, the sequencer circuit is configured to in response to a second determination of an out-of-lock condition of the sampling clock with respect to the first data signal based on the lock condition signal, continue the reset operation.

In some embodiments, the reset operation includes: sending a first reset signal to the frequency register to reset the accumulated total using a first sequence element of the sequence at a first time; and sending a second reset signal to the frequency register to reset the accumulated total using a second sequence element following the first sequence element at a second time based on a frequency accumulator reset period.

In some embodiments, the lock detector circuit is configured to update the lock conditional signal based on an integration period. The frequency accumulator reset period is N times the integration period, where N is an integer greater than one.

In some embodiments, the sequence circuit includes a counter to be set to a count. The counter is configured to increment to the count responsive to cycles of the first reference clock. The count of the cycles defines the frequency accumulator reset period.

In some embodiments, the lock detector circuit is configured to generate the lock condition signal based on the accumulated total from the frequency register.

In some embodiments, each sequence element corresponds to an estimate of the frequency difference.

In some embodiments, absolute values of the sequence elements of the sequence are in ascending order.

In some embodiments, the CDR circuit includes a digital loop filter coupled to the phase detector and a phase interpolator. The digital loop filter includes a phase path configured to provide a phase path correction signal including first phase estimate information associated with the first data signal based on the phase detect result signal; a frequency path configured to provide a frequency path correction signal including frequency offset estimate information based on the accumulated total from the frequency accumulator; a summing circuit configured to generate second phase estimate information associated with the first data signal based on the phase path correction signal and the frequency path correction signal; a phase accumulator configured to accumulate the second phase estimate information to generate a phase accumulated total signal; and a phase interpolator code generator configured to generate a phase interpolator code based on the phase accumulated total signal. The phase interpolator is configured to update the sampling clock based on the phase interpolator code.

In some embodiments in accordance with the present disclosure, a method includes generating a phase detect result signal in response to phase detection of a plurality of samples, the plurality of samples being generated by sampling a first data signal received from a receiver based on a sampling clock; accumulating, using a frequency register, frequency offset information from the phase detect result signal to generate an accumulated total; storing, in the frequency register, the accumulated total; providing, from the frequency register, the accumulated total for updating the sampling clock; and performing a reset operation to reset the accumulated total in the frequency register based on a sequence of sequence elements. The frequency offset information is associated with a frequency difference between a first reference clock of the receiver and a second reference clock associated with the first data signal.

In some embodiments, the method includes in response to a first determination of a locked condition of the sampling clock with respect to the first data signal based on a lock condition signal from a lock detector circuit, stopping the reset operation.

In some embodiments, the method includes in response to a second determination of an out-of-lock condition of the sampling clock with respect to the first data signal based on the lock condition signal, continuing the reset operation.

In some embodiments, the method includes updating the lock conditional signal based on an integration period. The frequency accumulator reset period is N times the integration period, where N is an integer greater than one.

In some embodiments, the method includes determining, using a counter configured to increment to a count responsive to cycles of the first reference clock, the frequency accumulator reset period.

In some embodiments, the method includes generating the lock condition signal based on the accumulated total from the frequency register.

In some embodiments, the method includes providing, by a phase path, a phase path correction signal including first phase estimate information associated with the first data signal based on the phase detect result signal; providing, by a frequency path, a frequency path correction signal including frequency offset estimate information based on the accumulated total from the frequency register; generating second phase estimate information associated with the first data signal based on the phase path correction signal and the frequency path correction signal; accumulating the second phase estimate information to generate a phase accumulated total signal; generating a phase interpolator code based on the phase accumulated total signal; and updating the sampling clock based on the phase interpolator code.

Other aspects and features will be evident from reading the following detailed description and accompanying drawings.

BRIEF DESCRIPTION OF THE DRAWINGS

FIG. 2A is a block diagram illustrating an example of a communication system according to some embodiments of the present disclosure.

FIG. 5 illustrates an exemplary sequence table according to some embodiments of the present disclosure.

DETAILED DESCRIPTION

Figure 1:
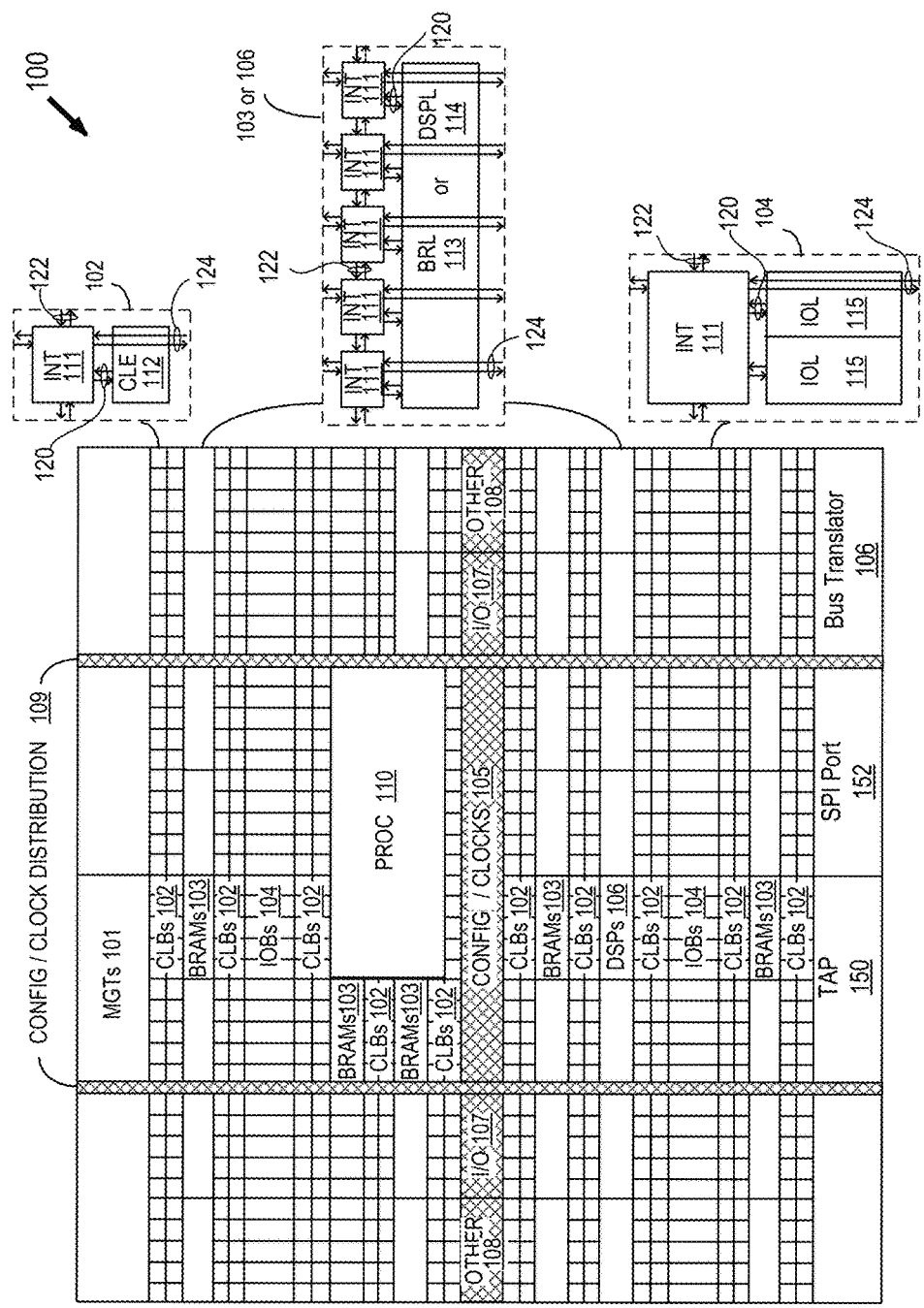
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, the lock condition of the CDR circuit may be susceptible to a frequency difference, also referred to as a frequency offset, between transmitter and receiver reference clock signals. As such, the CDR circuit may have a particular reachable frequency offset range (e.g., between −5000 ppm and 5000 ppm). For example, the CDR circuit may not achieve a locked condition if the frequency offset is beyond that particular reachable frequency offset range. In some embodiments, an operator may monitor the performance of the CDR circuit (e.g., by monitoring the quality of data reception of the receiver), and manually configure the CDR circuit (e.g., by manually setting an initial value of a frequency accumulator in the frequency path of the CDR circuit) to expand the CDR circuit's reachable frequency offset range. Such embodiments may require the operator to have an estimate of the actual frequency offset, which may not be readily available to the operator. Further, such a manual process by the operator may be time-consuming. For example, the operator may use the quality of data reception as an indicator of a locked condition of the CDR circuit. However, the operator may observe that the data reception in the receiver has good quality way after the CDR circuit became locked. Additionally, the frequency offset may drift (e.g., because of the long-term stability of oscillation frequency in the transmitter and receiver reference clocks), which makes the manual process by the operator even more challenging. For integrated circuit (IC) solutions, it has been discovered that a sequencer may be used to automatically resetting initial values of a frequency accumulator in the frequency path of the CDR circuit, thereby expanding the reachable frequency offset range automatically.

With the above general understanding borne in mind, various embodiments for implementing CDR are generally described below. Various advantages may be present in various applications of the present disclosure. No particular advantage is required for all embodiments, and different embodiments may offer different advantages. One of the advantages of some embodiments is that by using a sequencer, the initial value of the frequency accumulator in the CDR circuit may be reset automatically, thereby expanding the reachable frequency offset range of the CDR circuit. Another of the advantages of some embodiments is that the sequencer and the frequency accumulator reset operation may be controlled by a lock condition signal from a lock detector circuit. As such, the frequency accumulator reset operation may start or stop based on the lock condition signal, which is more efficient compared to determining the lock condition of the CDR circuit by relying on the quality of the data reception in the receiver for determining the lock condition of the CDR circuit.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of micropro-cessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the CDR is not limited to the exemplary IC depicted in FIG. 1, and that IC having other configurations, or other types of IC, may also implement the methods and systems for CDR.

Referring to the example of FIG. 2A, illustrated is an example of a serial communication system 200. The serial communication system 200 includes a transmitter 202 coupled to a receiver 204 over transmission medium 206. The transmitter 202 can be part of a serializer-deserializer (SerDes) 208. The receiver 204 can be part of a SerDes 210. The transmission medium 206 may include an electrical path between the transmitter 202 and the receiver 204. The transmission medium 206 may include printed circuit board (PCB) traces, vias, cables, connectors, decoupling capacitors, and the like. In some examples, the SerDes 208 may be disposed in an integrated circuit (IC) 212, and the SerDes 210 can be disposed in an IC 214.

The transmitter 202 drives serial data onto the transmission medium 206 using a digital baseband modulation technique. In general, the serial data is divided into symbols. The transmitter 202 converts each symbol into an analog voltage mapped to the symbol. The transmitter 202 couples the analog voltage generated from each symbol to the transmission medium 206. In some examples, the transmitter 202 uses a binary non-return-to-zero (NRZ) modulation scheme. In binary NRZ, a symbol is one bit of the serial data and two analog voltages are used to represent each bit. In other examples, the transmitter 202 uses multi-level digital baseband modulation techniques, such as pulse amplitude modulation (PAM), where a symbol includes a plurality of bits of the serial data and more than two analog voltages are used to represent each bit.

The receiver 204 may include a clock and data recovery (CDR) circuit 216. The receiver 204 receives an analog signal from the transmission medium 206. The CDR circuit 216 operates to recover data and a clock from the analog signal. The receiver 204 provides the recovered data to physical coding sublayer (PCS) circuitry 218 in SerDes 210 for decoding and further processing.

As illustrated in FIG. 2A, the transmitter 202 may use a transmitter reference clock 220, and the receiver 204 may use a receiver reference clock 222. In some examples, there is a difference between the transmitter reference clock 220 and the receiver reference clock 222, which may be referred to as a frequency offset between the transmitter reference clock 220 and the receiver reference clock 222. A frequency offset may exist when the transmitter reference clock 220 and the receiver reference clock 222 use independent clock sources (e.g., clock sources that are nominally but not exactly identical in frequency). In some embodiments, the frequency offset may be fixed (e.g., equal to a constant). In some embodiments, the frequency offset may not be fixed, for example, is a periodic function of time.

Figure 2B:
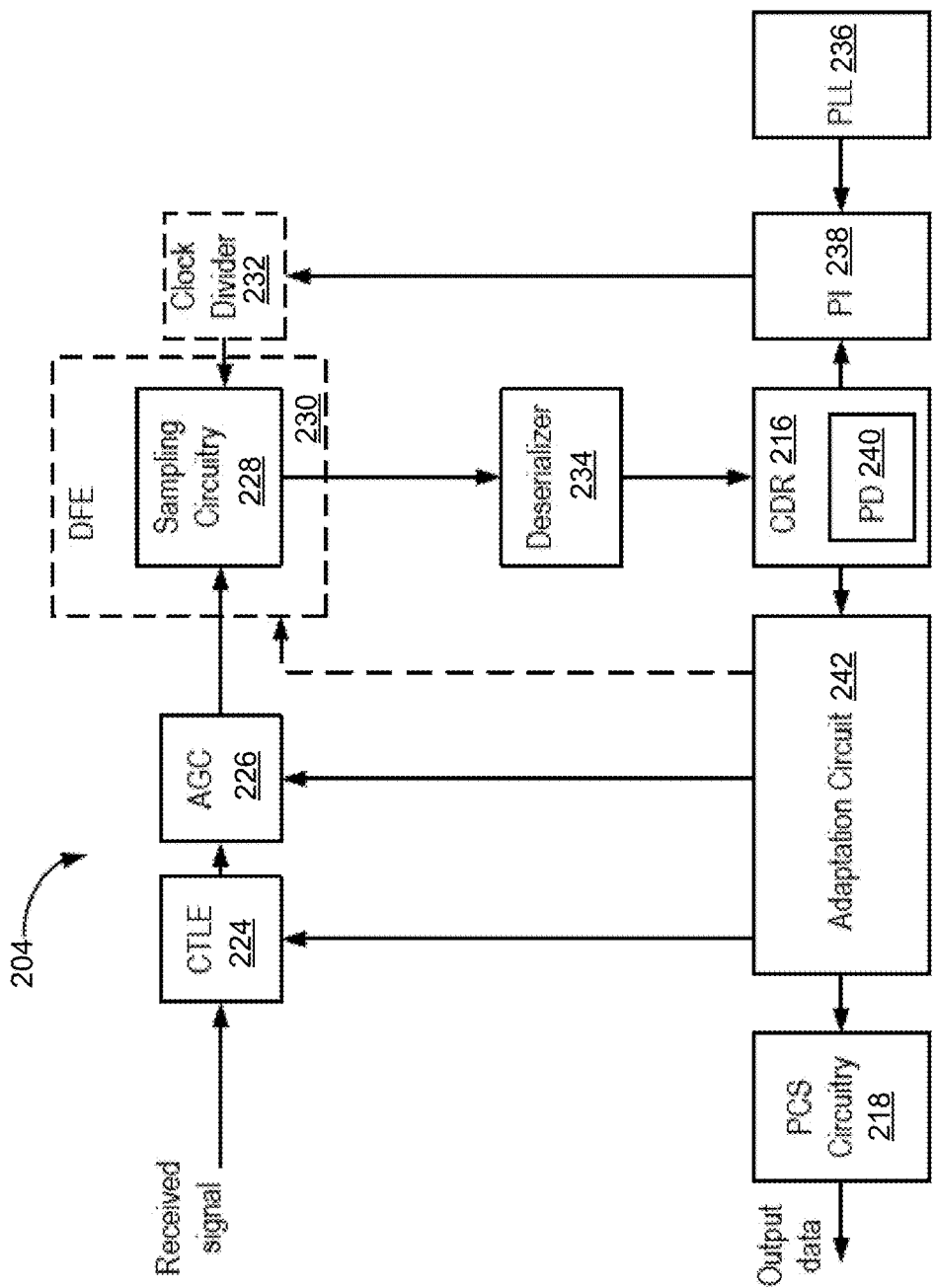
FIG. 2B is a block diagram illustrating an example of a receiver according to some embodiments of the present disclosure.

Referring to FIG. 2B, illustrated therein is a block diagram depicting the receiver 204 according to an example. The receiver 204 includes a continuous time linear equalizer (CTLE) 224, an automatic gain control (AGC) circuit 226, sampling circuitry 228, a deserializer 234, the CDR circuit 216, a phase interpolator (PI) 238, and an adaptation circuit 242. An output of the CTLE 224 is coupled to an input of the AGC circuit 226. An output of the AGC circuit 226 is coupled to inputs of the sampling circuitry 228. An output of the clock divider 232 is coupled to inputs of the sampling circuitry 228. An output the sampling circuitry 228 is coupled to an input of the deserializer 234. An output of the deserializer 234 is coupled to an input of the CDR circuit 216. Outputs of the CDR circuit 216 are coupled to an input of the adaptation circuit 242 and an input of the PI 238, respectively. Another input of the PI 238 is coupled to an output of a phase locked loop (PLL) circuit 236. In an example, an output of the PI 238 is coupled to an input of the sampling circuitry 228. In another example, the output of the PI 238 is coupled to an input of a clock divider 232, and an output of the clock divider 232 is coupled to an input of the sampling circuitry 228. Outputs of the adaptation circuit 242 are coupled to the CTLE 224, the AGC circuit 226, and the PCS circuitry 218, respectively. In an example, the sampling circuitry 228 can be part of a decision feedback equalizer (DFE) 230. In such case, another output of the adaptation circuit 242 is coupled to the DFE 230.

In operation, the CTLE 224 receives an analog signal from the transmission medium 206. The CTLE 224 operates as a high-pass filter to compensate for the low pass characteristics of the transmission medium 206. The peak of the frequency response of the CTLE 224 may be adjusted based on a CTLE adjust signal provided by the adaptation circuit 242. The AGC circuit 226 receives the equalized analog signal from the CTLE 224. The AGC circuit 226 adjusts the gain of the equalized signal based on a gain adjust signal provided by the adaptation circuit 242. In another example, the AGC circuit 226 can precede the CTLE circuit 224.

The sampling circuitry 228 generates data and crossing samples from the output of the AGC circuit 226 based on a sampling clock signal supplied by the PI 238. The sampling circuitry 228 may generate the data samples using a data sampling clock and the crossing samples using a crossing sampling clock, where the crossing sampling clock is shifted in phase from the data sampling clock by 90 degrees. The sampling circuitry 228 can generate both the data and crossing sampling clocks from the sampling clock signal supplied by the PI 238 (e.g., using a 90-degree phase shifter). Alternatively, the PI 238 can supply a sampling clock signal that includes both the data and crossing sampling clocks. In another example, the clock divider 232 can generate the data and crossing sampling clocks from the sampling clock signal supplied by the PI 238. The clock divider 232, if present, can also reduce the frequency of the sampling clock signal supplied by the PI 238. In an example, the sampling circuitry 228 is part of the DFE 230. The DFE 230 equalizes the output of the AGC circuit 226 to minimize inter-symbol interference (ISI).

Each data and crossing sample includes one or more bits depending on the type of modulation scheme employed (e.g., one-bit samples for binary NRZ and multi-bit samples for PAM). The deserializer 234 groups data samples and crossing samples to generate a deserialized signal. The deserializer 234 unifies the two separate parallel data and crossing sample streams into a deserialized signal to be processed by the CDR circuit 216.

The CDR circuit 216 generates a PI code signal from the deserialized signal generated by the deserializer 234. The PI 238 receives a reference clock signal from the PLL 236. The PI 238 shifts the phase of the reference clock signal based on the PI code signal output by the CDR circuit 216. The PI 238 outputs the phase-shifted reference clock signal as the sampling clock signal.

The CDR circuit 216 outputs a data signal to the adaptation circuit 242. The data signal includes the data samples output by the sampling circuitry 228. The adaptation circuit 242 generates control signals for the CTLE 224 and the AGC circuit 226 based on data signal using adaptation algorithms. If the DFE 230 is present, the adaptation circuit 242 generates a control signal for adjusting the taps of the DFE 230. The adaptation circuit 242 outputs the data signal to the PCS circuitry 218. The PCS circuitry 218 processes the data signal to recover the transmitted data.

In an example, the CDR circuit 216 includes a phase detector (PD) 240. The phase detector 240 determines whether to adjust the data sampling phase of a sampling clock and in which direction the data sampling phase should be adjusted. In an example, the phase detector 240 includes at least one bang-bang phase detector each operating on a pair of data bits and a crossing bit. The phase detector 240 generates a phase detect result signal. The phase detect result signal provides a net phase detect result from the bang-bang phase detectors. In an example, the net phase detect result may indicate whether the data sampling phase based on the sampling clock need to be adjusted, in which direction the data sampling phase need to be adjusted, and where to stop the adjustment. In an example where the data sampling phase is disposed in the center of the data eye, the CDR circuit is considered locked. In such an example, the sampling clock is also considered locked with respect to the received signal. Once a locked condition is achieved, the data sampling phase may then dither around the locked position.

Figure 2C:
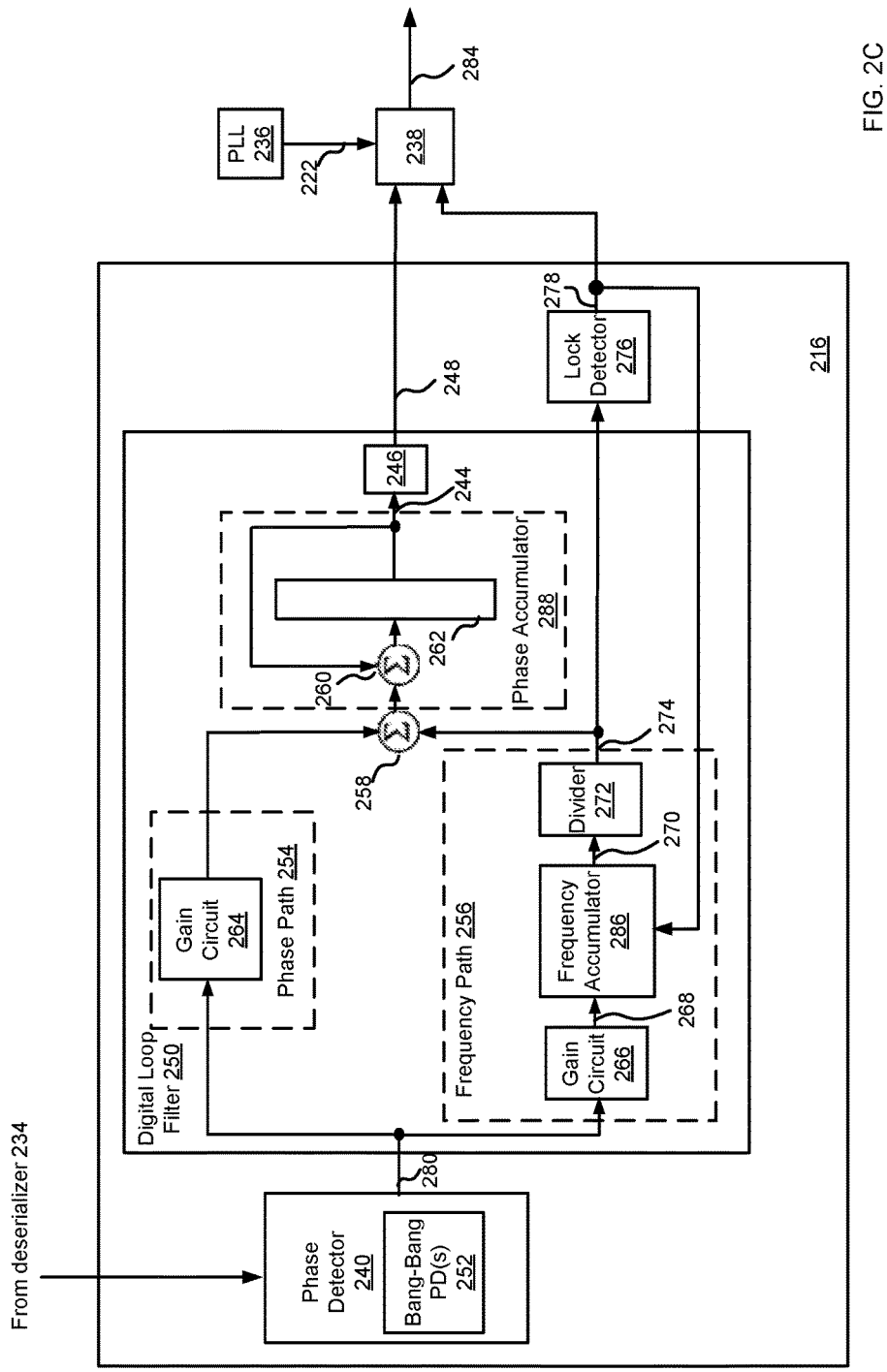
FIG. 2C is a block diagram illustrating an example of a CDR circuit according to some embodiments of the present disclosure.

Referring to FIG. 2C, illustrated is an exemplary CDR circuit 216. The CDR circuit 216 includes the phase detector 240, a digital loop filter 250, and a lock detector 276. An input of the phase detector 240 is coupled to an output of a deserializer 234 of the receiver 204, where the deserializer is coupled to an output of a sampling circuitry 228 of the receiver 204. An output of the phase detector 240 is coupled to an input of the digital loop filter 250.

In the example of FIG. 2C, the digital loop filter 250 includes a phase path 254, a frequency path 256, a summing circuit 258, a phase accumulator 288, and a phase divider 246 having a phase divider factor (a phase scaling factor). The phase accumulator 288 includes a summing circuit 260 and a phase register 262.

In some embodiments, the phase path 254 may provide a phase path correction signal. The phase path correction signal may include information associated with a phase estimate of the received data signal, which may be used to adjust the phase of the sampling clock. The phase path 254 may include a gain circuit 264 (e.g., a gain circuit including one or more multipliers). An input to the gain circuit 264 is coupled to an output of the phase detector 240, and an output of the gain circuit 264 is coupled to an input of the summing circuit 258.

The frequency path 256 may provide a frequency path correction signal. The frequency path correction signal may include information associated with a frequency estimate (e.g., a frequency offset estimate) associated with the received data signal. Such a frequency estimate may be used to adjust the phase of the sampling clock. In an example, the frequency path 256 is used to track the frequency offset between the transmitter reference signal and the receiver reference signal. The frequency path correction signal may be associated with a frequency offset estimate, which may be used to update a phase estimate of the phase position of the received signal. Such a phase estimate may then be used to adjust the sampling clock to compensate for shifts in the frequency spectrum (e.g., caused by jitters and/or spread spectrum clocking (SSC)). The frequency path 256 may include a gain circuit 266 (e.g., a gain circuit including one or more multipliers), a frequency accumulator 286, and a divider 272 having a frequency divider factor (frequency scaling factor). An input to the gain circuit 266 is coupled to an output of the phase detector 240. An output 268 of the gain circuit 266 is coupled to an input of the frequency accumulator 286. An output 270 of the frequency accumulator 286 is coupled to an input of the divider 272. An output 274 of the frequency path 256 is coupled to another input of the summing circuit 258. The output 274 may also be referred to as a frequency path correction signal 274.

In some embodiments, a phase accumulator 288 is coupled to receive the phase path correction signal and the frequency path correction signal. The summing circuit 260 is coupled to an input of the phase register 262. An output of the phase register 262 is coupled to another input of the summing circuit 260 and to an input of a divider 246. The output 248 of the phase divider 246 is coupled to an input of a PI 238.

In operation, the phase detector 240 generates a phase detect result signal 280 based on the data and crossing samples in the deserialized data provided by the deserializer 234. The phase detector 240 can include a plurality of bang-bang phase detectors 252, each bang-bang phase detector 252 generating an individual phase detect result based on a pair of data samples and a crossing sample. The bang-bang phase detectors 252 can generate individual phase detect results using different sets of data/crossing samples. The phase detector 240 combines the individual phase detect results to generate the net phase detect result, and outputs a phase detect result signal 280 having the net phase detect result to the digital loop filter 250.

In some examples, the digital loop filter 250 performs a CDR algorithm to adjust the PI code signal 248 based on the phase detect result signal 280. In the phase path 254, the gain circuit 264 applies a phase gain (Gp) to the phase detect result signal 280. For example, the gain circuit 264 may implement a left-shift operation to apply the phase gain.

In some examples, in the frequency path 256, the gain circuit 266 applies a frequency gain (Gf) to the phase detect result signal 280. For example, the gain circuit 266 may implement a left-shift operation to apply the frequency gain. The output of the gain circuit 266 is integrated by the frequency accumulator 286, and then is divided by a divider 272. The output 274 of the frequency path 256 may be added to the output of the phase path 254 by the summing circuit 258.

In some embodiments, the phase accumulator 288 may accumulate phase information included in the output of the summing circuit 258 to generate a phase accumulated total signal 244 using the summing circuit 260 and the phase register 262. The phase accumulated total signal 244 is sent to an input of a phase divider 246 having a phase divider factor. The phase divider 246 outputs a PI code signal 248.

In the example of FIG. 2C, the digital loop filter 250 provides the PI code signal 248 to the input of a PI 238. The PI 238 may receive a receiver reference clock signal 222 (e.g., provided by a PLL 236), and generate a sampling clock signal 284 based on the PI code signal 248 and the receiver reference clock signal 222. The sampling clock signal 284 may be provided to the sampling circuitry 228 of the receiver 204 for sampling a received signal. The sampling clock signal 284 may also be sent to the phase detector 240, where the phase detector 240 may generate the phase detect result signal 280 based on the deserialized signal from the deserializer and the sampling clock signal 284. The phase detector 240 may include at least one bang-bang phase detector 252.

In the example of FIG. 2C, the digital loop filter 250 also provides the frequency path correction signal 274 to a lock detector 276. The lock detector 276 may generate a lock condition signal 278 based on the frequency path correction signal 274. The lock condition signal 278 may indicate whether the CDR 216 is in a locked condition. In an example, the lock condition signal 278 is set to logic "high" to indicate a locked condition of the CDR 216 with respect to a phase of the input data from the deserializer 234, and is set to logic "low" to indicate an unlocked or out-of-lock condition of the CDR 216 with respect to a phase of the input data from the deserializer 234. The lock condition signal 278 may then be sent to the PI 238, which may determine the sampling clock signal 284 based on the PI code signal 248 and the lock condition signal 278.

Referring to FIGS. 3, 4, 5, and 6, systems and methods for automatically resetting the frequency accumulator's initial value in the frequency path of a CDR circuit are described. By using a sequencer circuit to automatically reset initial values of the frequency accumulator, the reachable frequency offset range of the CDR circuit is expanded.

Figure 3:
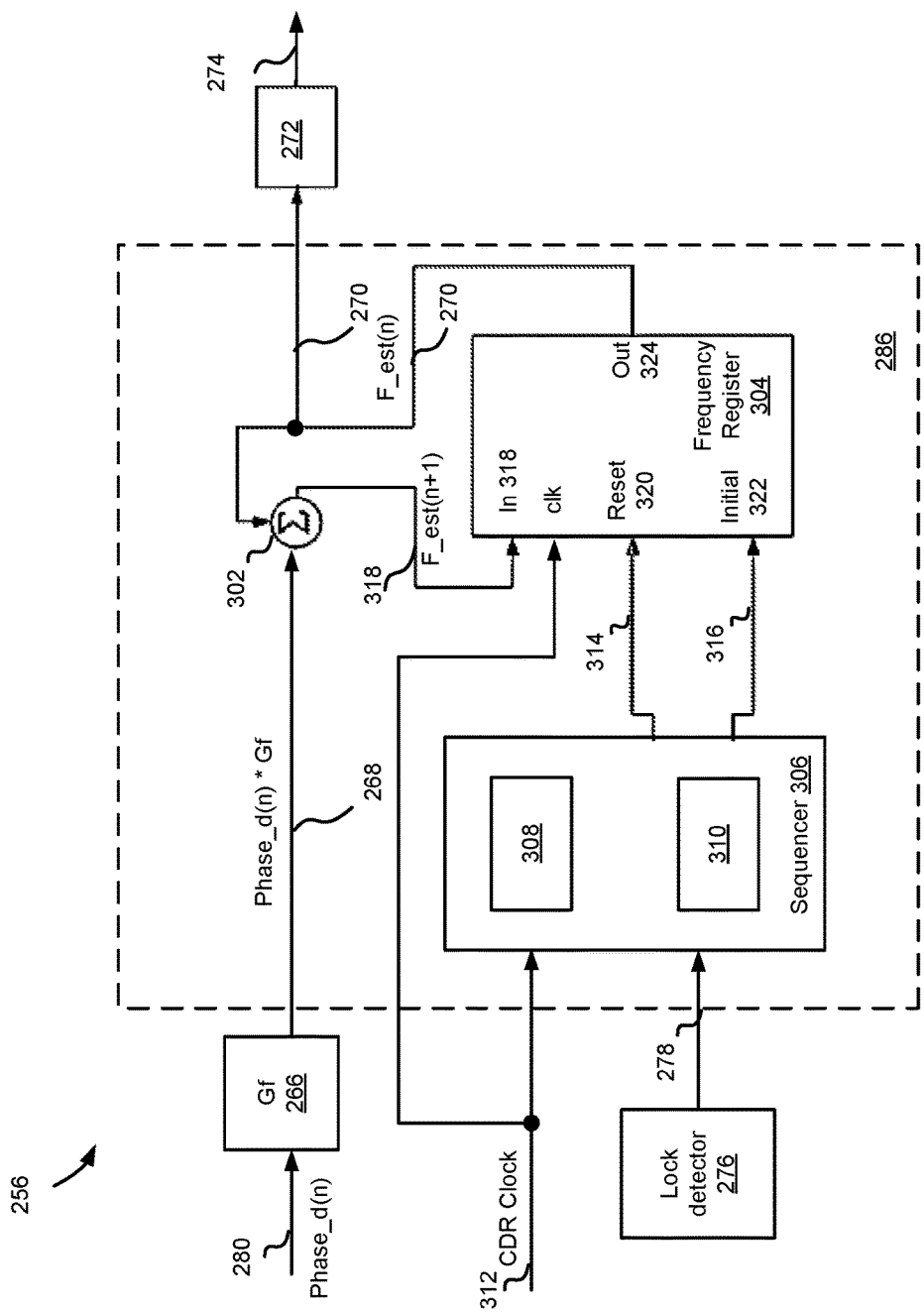
FIG. 3 is a block diagram illustrating an example of a frequency accumulator circuit according to some embodiments of the present disclosure.

Referring to FIG. 3, a frequency accumulator 286 used in the frequency path 256 is illustrated. The frequency accumulator 286 includes a summing circuit 302, a frequency register 304, and a sequencer 306. The sequencer 306 includes a counter 308 and a sequence table 310.

In some embodiments, at the $n^{th}$ CDR cycle, the frequency accumulator 286 provides an output signal 270 including an estimate of the frequency offset, denoted as F_est(n). As shown in FIG. 3, F_est(n+1) may be computed as follows:

$$F\_est(n+1)=F\_est(n)+\text{Phase}\_d(n)*Gf,$$

where F_est(n+1) denotes a frequency offset estimate of the $(n+1)^{th}$ CDR cycle, F_est(n) denotes a frequency offset estimate at the $n^{th}$ CDR cycle, Phase_d(n) denotes a phase detect result at the $n^{th}$ CDR cycle (e.g., included in the output 280 of the PD 240), and Gf denotes the frequency gain applied by the gain circuit 266. In an example, the result of Phase_d(n)*Gf may correspond to a change in the frequency offset estimate, and may also be referred to as a frequency offset estimate change.

As such, the frequency accumulator 286 accumulates the frequency offset estimate information by adding the frequency offset estimate changes, thereby generating an accumulated total. The accumulated total may then be temporarily stored in a frequency register 304, and be provided in the signal 270 in the next clock cycle. In an example, the accumulated total may correspond to a frequency offset estimate. Specifically, in the example of FIG. 3, at the $n^{th}$ cycle, the summing circuit 302 combines signal 268 including Phase_d(n)*Gf and signal 270 including F_est(n) from an output 324 of the frequency register 304, and generates a signal 318 including F_est(n+1). The signal 318 including F_est(n+1) is sent to an input 318 of the frequency register 304, which may temporarily store F_est(n+1), and provide F_est(n+1) at the output 324 at the $(n+1)^{th}$ CDR cycle.

As illustrated in FIG. 3, in some embodiments, the frequency accumulator 286 includes a sequencer 306, which may be used to reset the initial value of the frequency register 304, thereby resetting F_est(n) in the signal 270 from the output 324 of the frequency register 304. The sequencer 306 may receive a CDR clock signal 312 (e.g., a receiver reference clock signal 222) and a lock condition signal 278 from a lock detector 276. In an example, the frequency register 304 is clocked by the CDR clock signal 312.

In some embodiments, the sequencer 306 may include a counter 308 for controlling the reset pulses in the reset signal 314 based on a frequency accumulator reset period. In an example, the counter 308 may receive a count set signal for setting the counter 308 to count up to a number, and then returning to counting from a starting number to provide a particular frequency accumulator reset period. Such a frequency accumulator reset period may be used to determine whether to generate a next reset pulse. In an example, the counter 308 may be set to count from 0 to 5000, such as 5000 cycles of the CDR clock signal 312. Once the counter 308 reaches a set count value corresponding to the frequency accumulator reset period, the counter 308 may generate a reset signal 314 including a reset pulse. The reset signal 314 may be sent to a reset input 320 of the frequency register 304. Responsive to the reset signal 314, the frequency register 304 may be reset using the sequence element provided at the initial input 322.

In some embodiments, the sequencer 306 may include a sequence table 310 storing a sequence of sequence elements. Each sequence element may correspond to an estimate of the actual frequency offset. In an example, when a first reset pulse is sent in the reset signal 314 to the reset input 320 of the frequency register 304, a first sequence element in the sequence may be sent in a signal 316 to an initial value input 322 of the frequency register 304. In response to the reset pulse received at the reset input 320, the frequency register 304 may reset its stored value using the first sequence element received at the initial value input 322. This first sequence element may then be provided in the signal 270 from the output 324 of the frequency register 304. In some embodiments, when a second reset pulse after the first reset value is sent to the reset input 320, the sequencer 306 may send a second sequence element following the first element in the sequence to the initial value input 322 of the frequency register 304. As such, the signal 270 from the output 324 of the frequency register 304 may then include the second sequence element.

Figure 4:
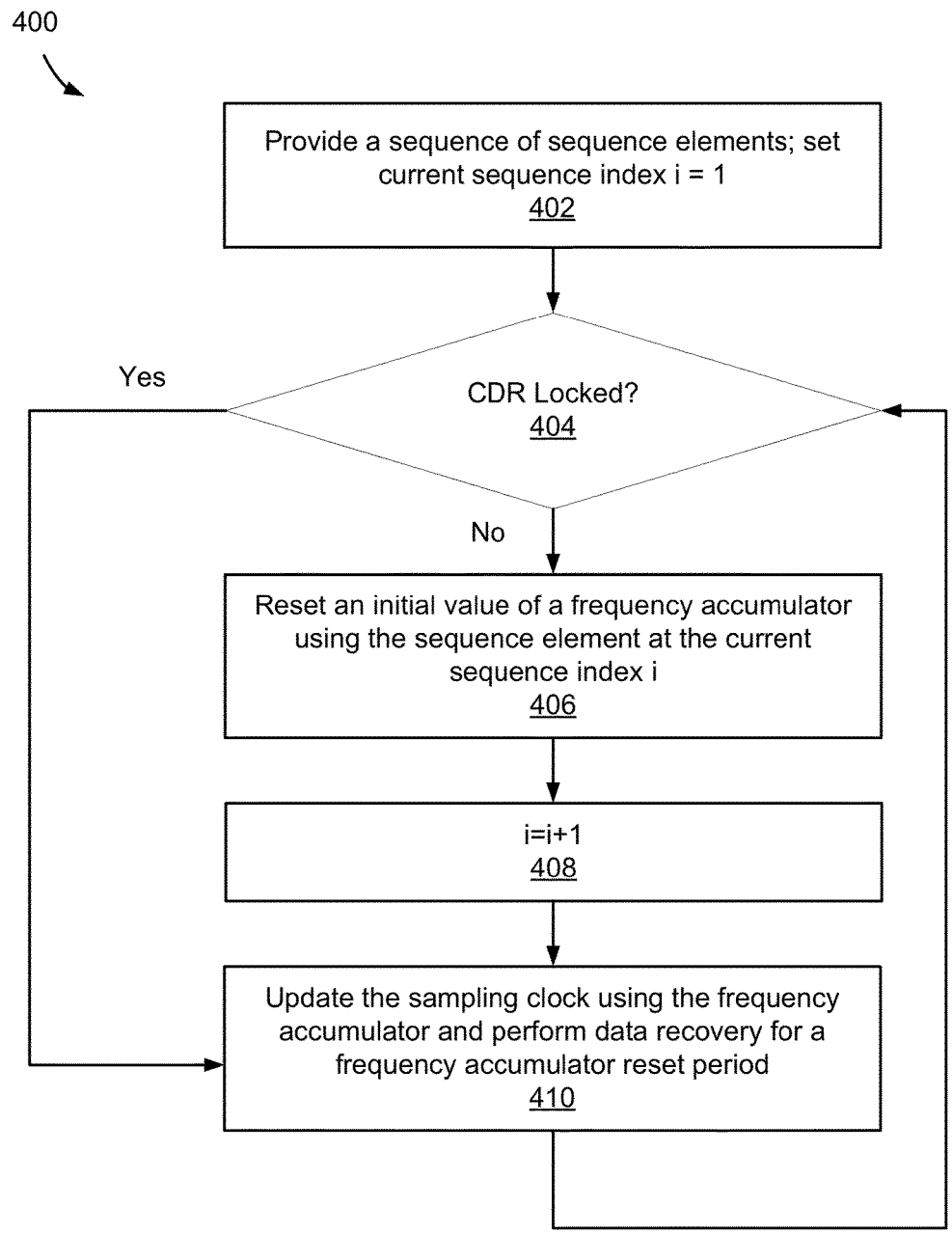
FIG. 4 is a flow diagram illustrating an example of a method for automatically resetting a frequency accumulator circuit according to some embodiments of the present disclosure.

Referring to FIG. 4, illustrated is a method for automatically resetting the frequency accumulator's initial value in the frequency path of a CDR circuit, thereby automatically setting the value of the F_est(n) in the signal 270. By setting the frequency offset estimate F_est(n) closer to the actual frequency offset using a sequencer, the frequency offset acquisition range of the CDR is expanded.

The method 400 begins at block 402, where a sequence of sequence elements is provided. In some examples, an operator may provide a sequence of sequence elements stored in a sequence table 310 of a sequencer 306. Referring to FIG. 5, illustrated is an exemplary sequence table 310. Each entry of the sequence table 310 may include a sequence index 502 and a corresponding element 504. In some embodiments as illustrated in FIG. 5, the sequence includes a first element having a value of 0 ppm at a sequence index 502 of one. In the example of FIG. 5, the sequence may include pairs of elements with opposite signs (e.g., 1000 ppm and −1000 ppm, 2000 ppm and −2000 ppm) following the first element.

In various embodiments, the sequence stored in the sequence table 310 may have different lengths, different values, and/or different step sizes between adjacent elements. In some embodiments, the first element may not equal to zero. For example, the first element at the sequence index of one may be 1000 ppm where the operator estimates that the actual sequence offset is greater than 1000 ppm. In some embodiments, the last element (e.g., at a sequence index 502 of 21) in a sequence may be determined by a highest/lowest possible frequency offset estimate (e.g., 10000 ppm/−10000 ppm) provided by the operator.

In some embodiments, as illustrated in the example of FIG. 5, the sequence may have the same step size between adjacent negative elements and adjacent positive elements. For example, adjacent positive elements at sequence indexes of 2, 4, 6, . . . , 20 have the same step size of 1000 ppm. For further example, adjacent negative elements at sequence indexes 3, 5, . . . , 21 have the same step size of −1000 ppm. Alternatively, in some embodiments, adjacent negative elements and adjacent positive elements may have different step sizes. In an example, in a particular sequence (e.g., a sequence including elements of 0, 1000 ppm, −1000 ppm, 2000 ppm, −2000 ppm, 2500 ppm, and −2500 ppm), the step sizes between adjacent elements having the same sign may decrease when the absolute values of the elements increase. In another example, in a particular sequence (e.g., a sequence including elements of 0, 1000 ppm, −1000 ppm, 2000 ppm, −2000 ppm, 4000 ppm, and −4000 ppm), the step sizes between adjacent elements having the same sign may increase when the absolute values of the elements increase.

In some embodiments, at block 402, the sequencer 306 may initialize a current sequence index i indicating the current index of the sequence. In an example, the current sequence index i has an initial value of one.

The method 400 may then proceed to block 404, where the sequencer may determine whether the CDR circuit is in a locked condition. At block 404, a sequencer 306 may receive a lock condition signal 278, and determine whether the CDR circuit 216 is locked based on the lock condition signal 278.

In some embodiments, at block 404, the sequencer 306 determines that the CDR circuit 216 is in an unlocked or out-of-lock condition based on the lock condition signal 278. In response to such a determination, the method 400 may proceed to block 406, where the sequence may reset an initial value of a frequency accumulator based on the element at the current sequence index i. In some embodiments, at block 406, the sequencer 306 may determine the current element (e.g., 0 ppm) at the current sequence index i (e.g., one) according to a sequence table 310. The sequencer 306 may then reset an initial value of the frequency accumulator 286 by setting the initial value of the frequency register 304. For example, the sequencer 306 may send a reset signal 314 including a reset pulse to the reset input 320 of the frequency register 304, and send a signal 316 including the current element to the initial value input 322 of the frequency register 304. In response to the reset pulse and current element received at inputs 320 and 322, the frequency register 304 may set its stored value to the received current element. That stored value may then be provided in the signal 270 from the output 324, which is provided as an output 270 of the frequency accumulator 286.

The method 400 may then proceed to block 408, where the current sequence index i is increased by one. In an example where the updated current sequence index i has a value (e.g., 22) that is greater than a length of the sequence (e.g., 21), the sequencer 306 may set the current sequence index i to one. As such, the sequencer 306 may use the sequence repeatedly for resetting the initial value of the frequency accumulator 286. After updating the current sequence index i, the method 400 may then proceed to block 410.

In some embodiments, at block 404, the sequencer 306 may determine that the CDR circuit is in a locked condition based on the lock condition signal 278. In response to that determination, the method 400 may proceed to block 410 directly from block 404 without resetting the initial value of the frequency accumulator 286.

In some embodiments, at block 410, the CDR circuit 216 updates its sampling clock using the frequency accumulator 286 for a frequency accumulator reset period. The sampling clock may be used for data recovery of the receiver 204. In some examples, the phase detector 240 may generate the phase detect result signal 280 using the sampling clock.

In some embodiments, the frequency accumulator reset period may be determined based on an integration period of the lock detector 276. The integration period of the lock detector 276 may define how often the lock detector 276 updates the lock condition in the lock condition signal 278. In an example, the lock detector 276 may determine the lock condition of the CDR circuit based on the frequency path correction signal 274. In that example, the lock detector 276 may determine the integration period based on the frequency path correction signal 274, and update the lock condition value in the lock condition signal after integrating the received values over the integration period.

In some embodiments, the frequency accumulator reset period may be N (e.g., five) times of the integration period of the lock detector 276, where N is an integer greater than one. Such a frequency accumulator reset period may ensure that the sequencer 306 has received at least one lock condition value that is determined after the sequencer 305 reset the initial value of the frequency register 304.

In some embodiments, the frequency accumulator reset period may be determined based on a predetermined integration period. In an example, the lock detector 276 has a predetermined integration period of 1000 CDR cycles, and the predetermined reset period may be set to be 5000 CDR cycles.

In some embodiments, the frequency accumulator reset period may be determined dynamically based on an integration period determined by the lock detector 276. For example, the lock detector 276 may determine its integration period based on jitter and/or SSC. In those examples, the sequencer 306 may receive the integration period from the lock detector 276, and then dynamically adjust the frequency accumulator reset period based on the integration period.

In some embodiments, at block 410, a counter 308 of the sequencer 306 may be used to determine whether the receiver has performed data recovery for a frequency accumulator reset period. The counter 308 may receive the CDR clock signal 312, and count the number of CDR clock cycles. The sequencer 306 may determine that the data recovery has been performed for a frequency accumulator reset period after the counter 308 counts a number of cycles corresponding to the frequency accumulator reset period.

The method 400 may then proceed to block 404, where the sequencer 306 determines whether the CDR circuit is in a locked condition by using the frequency accumulator 286 with the new initial value. In some embodiments where the CDR circuit 216 is in a locked condition, the sequencer 306 may stop automatically resetting the initial value of the frequency accumulator 286. In some embodiments where the CDR circuit 216 is in an out-of-lock condition, the sequencer 306 may continue to automatically reset the initial value of the frequency accumulator 286 using the current element corresponding to the updated sequence index i.

Figure 6:
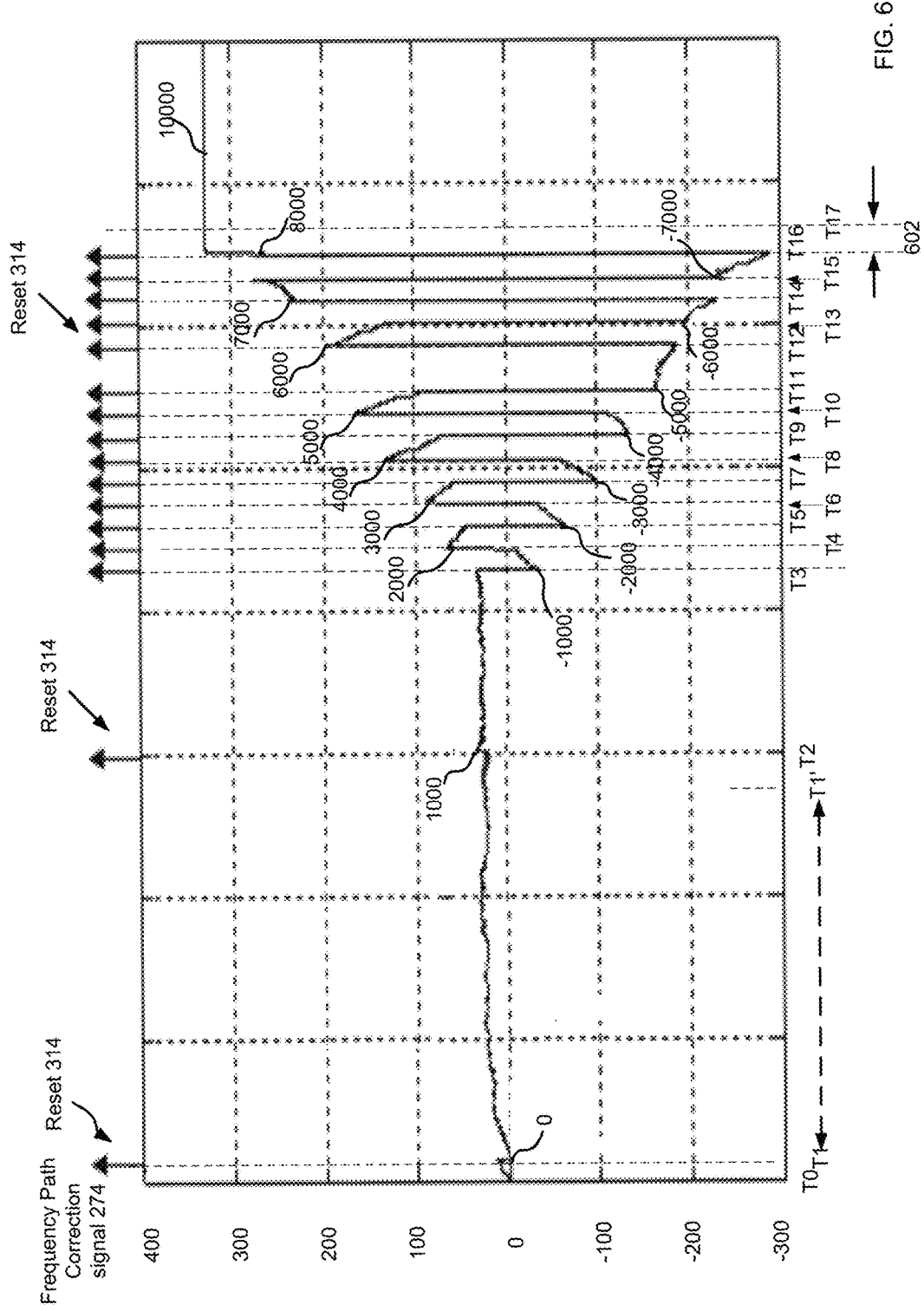
FIG. 6 illustrates a waveform of a frequency path correction signal of an exemplary CDR circuit according to some embodiments of the present disclosure.

Referring to FIG. 6, illustrated is a waveform of the frequency path correction signal 274 of the CDR circuit 216, where the method 400 is performed to automatically reset the initial value of the frequency accumulator 286 of the CDR circuit 216 until the CDR circuit 216 reaches a locked condition. Note that the frequency path correction signal 274 is proportional to the frequency accumulator output signal 270, where the frequency path correction signal 274 is generated by applying a frequency scaling factor to the frequency accumulator output signal 270 using the divider 272. As such, a frequency path correction value of the frequency path correction signal 274 is associated with a frequency offset estimate included in the frequency accumulator output signal 270.

As shown in FIG. 6, at time T1, a sequence element of 0 ppm at the sequence index of one is set as the initial value of the frequency register 304 (e.g., by sending a reset pulse 314 and a signal 316 including the element to the frequency register 304). Similarly, at time T2, a sequence element of 1000 ppm at the sequence index of two is used to set the initial value of the frequency register 304. As such, at time T2, the frequency path correction signal 274 has a value corresponding to 1000 ppm. In the example of FIG. 6, the sequencer 306 then set elements including −1000 ppm through 8000 ppm corresponding to sequence indexes 3 through 16 as initial values of the frequency register 304 at times T3 through T16 respectively.

In the example of FIG. 6, at time T16, the sequencer 306 determines that the CDR circuit 216 is in an out-of-lock condition, and set the initial value of the frequency register 304 to 8000 ppm. Shortly after time T16, the frequency path correction signal 274 becomes substantially constant at a value (e.g., around 330) corresponding to a frequency offset estimate of 10000 ppm, and the CDR circuit 216 is in a locked condition. As such, after a frequency accumulator reset period 602, at time T17, the sequencer 306 may determine that the CDR circuit 216 is in a locked condition, and stop the automatic reset process for resetting the initial value of the frequency register 304. As such, by automatically reset the initial value of the frequency accumulator 286, the reachable frequency offset range of the CDR circuit 216 is expanded to 10000 ppm. Furthermore, by continuously monitoring the lock condition of CDR circuit 216 using the lock condition signal 278, drifts in the frequency offset may also be addressed.

Note that in the example of FIG. 6, between times T1 and T3, the CDR lock detect signal 278 may incorrectly indicate a locked condition, while the CDR circuit is in an out-of-lock condition. This may happen in embodiments when the actual frequency offset is very large (e.g., 10000 ppm). In those embodiments, the output of the frequency path (e.g. the frequency correction signal 274) may have a small dithering for a particular period (e.g., between times T1 and T3). For example, between times T1 and T2, the CDR lock detect signal 278 may be tricked by the large actual frequency set, and thereby providing an indication that the CDR is locked while the CDR is actually in an out-of-lock condition. As such, there is no reset between times T1 and T2. Similarly, between times T2 and T3, the CDR lock detect signal 278 provides an indication that the CDR is locked while the CDR is actually in an out-of-lock condition. As such, there is no reset between times T2 and T3. However, after time T3 where the initial value of the frequency accumulator is reset to 2000 ppm, the output of the frequency path may respond faster, and the CDR lock detector may provide a correct lock condition within the predetermined lock detector integration period. As such, after time T3, the time periods between adjacent resets of the frequency accumulator are closer to the predetermined frequency accumulator reset period of the sequencer.

It is noted that various configurations (e.g., the type of the lock detector circuit, values of the sequencing steps and the step sizes, the frequency offset range) illustrated in FIGS. 2A through 6 are exemplary only and not intended to be limiting beyond what is specifically recited in the claims that follow. It will be understood by those skilled in that art in possession of this disclosure that other configurations may be used. For example, while the illustrated CDR circuit uses a lock detector circuit 276 that uses the frequency path correction signal 274 to generate the lock condition signal, a lock detector circuit that uses separate hardware (e.g., additional bang-bang phase detectors and leaky filter) for generating the lock condition signal may be used.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A clock and data recovery (CDR) circuit, comprising:
   a phase detector configured to generate a phase detect result signal in response to phase detection of a plurality of samples, the plurality of samples being generated by sampling a first data signal received from a receiver based on a sampling clock;
   a frequency accumulator configured to:
      accumulate, using a frequency register, frequency offset information from the phase detect result signal to generate an accumulated total,
         wherein the frequency offset information is associated with a frequency difference between a first reference clock of the receiver and a second reference clock associated with the first data signal;
      store, in the frequency register, the accumulated total; and
      provide, from the frequency register, the accumulated total for updating the sampling clock; and
   a sequencer circuit configured to:
      perform a reset operation to reset the accumulated total in the frequency register based on a sequence of sequence elements.

2. The CDR circuit of claim 1, wherein the sequencer circuit is configured to:
   in response to a first determination of a locked condition of the sampling clock with respect to the first data signal based on a lock condition signal from a lock detector circuit, stop the reset operation.

3. The CDR circuit of claim 2, wherein the sequencer circuit is configured to:
   in response to a second determination of an out-of-lock condition of the sampling clock with respect to the first data signal based on the lock condition signal, continue the reset operation.

4. The CDR circuit of claim 3, wherein the reset operation includes:
   sending a first reset signal to the frequency register to reset the accumulated total using a first sequence element of the sequence at a first time; and
   sending a second reset signal to the frequency register to reset the accumulated total using a second sequence element following the first sequence element at a second time based on a predetermined frequency accumulator reset period.

5. The CDR circuit of claim 4, wherein the lock detector circuit is configured to update the lock conditional signal based on an integration period; and
   wherein the predetermined frequency accumulator reset period is N times the integration period, where N is an integer greater than one.

6. The CDR circuit of claim 4, wherein the sequence circuit includes a counter to be set to a count,
   wherein the counter is configured to increment to the count responsive to cycles of the first reference clock, and
   wherein the count of the cycles defines the predetermined frequency accumulator reset period.

7. The CDR circuit of claim 2, wherein the lock detector circuit is configured to generate the lock condition signal based on the accumulated total from the frequency register.

8. The CDR circuit of claim 1, wherein each sequence element corresponds to an estimate of the frequency difference.

9. The CDR circuit of claim 1, wherein absolute values of the sequence elements of the sequence are in ascending order.

10. The CDR circuit of claim 1, further comprising:
    a digital loop filter coupled to the phase detector, the digital loop filter including:
       a phase path configured to provide a phase path correction signal including first phase estimate information associated with the first data signal based on the phase detect result signal;
       a frequency path configured to provide a frequency path correction signal including frequency offset estimate information based on the accumulated total from the frequency accumulator;
       a summing circuit configured to generate second phase estimate information associated with the first data signal based on the phase path correction signal and the frequency path correction signal;
       a phase accumulator configured to accumulate the second phase estimate information to generate a phase accumulated total signal; and
       a phase interpolator code generator configured to generate a phase interpolator code based on the phase accumulated total signal; and
    a phase interpolator configured to update the sampling clock based on the phase interpolator code.

11. A method, comprising:
    generating a phase detect result signal in response to phase detection of a plurality of samples, the plurality of samples being generated by sampling a first data signal received from a receiver based on a sampling clock;

accumulating, using a frequency register, frequency offset information from the phase detect result signal to generate an accumulated total,
  wherein the frequency offset information is associated with a frequency difference between a first reference clock of the receiver and a second reference clock associated with the first data signal;
storing, in the frequency register, the accumulated total;
providing, from the frequency register, the accumulated total for updating the sampling clock; and
performing a reset operation to reset the accumulated total in the frequency register based on a sequence of sequence elements.

12. The method of claim 11, further comprising:
in response to a first determination of a locked condition of the sampling clock with respect to the first data signal based on a lock condition signal from a lock detector circuit, stopping the reset operation.

13. The method of claim 12, further comprising:
in response to a second determination of an out-of-lock condition of the sampling clock with respect to the first data signal based on the lock condition signal, continuing the reset operation.

14. The method of claim 13, wherein the reset operation includes:
sending a first reset signal to the frequency register to reset the accumulated total using a first sequence element of the sequence at a first time; and
sending a second reset signal to the frequency register to reset the accumulated total using a second sequence element following the first sequence element at a second time based on a predetermined frequency accumulator reset period.

15. The method of claim 14, further comprising:
updating the lock conditional signal based on an integration period,
wherein the predetermined frequency accumulator reset period is N times the integration period, where N is an integer greater than one.

16. The method of claim 14, further comprising:
determining, using a counter configured to increment to a count responsive to cycles of the first reference clock, the predetermined frequency accumulator reset period.

17. The method of claim 12, further comprising:
generating the lock condition signal based on the accumulated total from the frequency register.

18. The method of claim 11, wherein each sequence element corresponds to an estimate of the frequency difference.

19. The method of claim 11, wherein absolute values of the sequence elements of the sequence are in ascending order.

20. The method of claim 11, further comprising:
providing, by a phase path, a phase path correction signal including first phase estimate information associated with the first data signal based on the phase detect result signal;
providing, by a frequency path, a frequency path correction signal including frequency offset estimate information based on the accumulated total from the frequency register;
generating second phase estimate information associated with the first data signal based on the phase path correction signal and the frequency path correction signal;
accumulating the second phase estimate information to generate a phase accumulated total signal;
generating a phase interpolator code based on the phase accumulated total signal; and
updating the sampling clock based on the phase interpolator code.

* * * * *